(12) United States Patent
Nakata

(10) Patent No.: US 8,552,519 B2
(45) Date of Patent: *Oct. 8, 2013

(54) SEMICONDUCTOR MODULE FOR POWER GENERATION OR LIGHT EMISSION

(75) Inventor: Josuke Nakata, Kyoto (JP)

(73) Assignee: Kyosemi Corporation, Kyoto (JP)

( * ) Notice: Subject to any disclaimer, the term of this patent is extended or adjusted under 35 U.S.C. 154(b) by 837 days.

This patent is subject to a terminal disclaimer.

(21) Appl. No.: 12/309,455

(22) PCT Filed: Aug. 7, 2006

(86) PCT No.: PCT/JP2006/315600
§ 371 (c)(1),
(2), (4) Date: Jan. 16, 2009

(87) PCT Pub. No.: WO2008/018116
PCT Pub. Date: Feb. 14, 2008

(65) Prior Publication Data
US 2010/0006865 A1 Jan. 14, 2010

(51) Int. Cl.
*H01L 27/14* (2006.01)

(52) U.S. Cl.
USPC ........... 257/444; 257/414; 257/428; 257/431; 257/432; 257/433; 257/443; 257/E31.001; 257/E27.122; 257/E27.123; 257/E27.124; 257/E25.004; 257/E25.005

(58) Field of Classification Search
None
See application file for complete search history.

(56) References Cited

U.S. PATENT DOCUMENTS

| 3,134,906 A | 5/1964 | Henker |
| 3,984,256 A | 10/1976 | Fletcher et al. |
| 4,638,110 A | 1/1987 | Erbert |
| 4,834,805 A | 5/1989 | Erbert |
| 5,431,741 A * | 7/1995 | Sakaguchi et al. ............ 136/244 |
| 5,437,736 A | 8/1995 | Cole |
| 5,482,568 A | 1/1996 | Hockaday |
| 5,720,827 A | 2/1998 | Simmons |
| 6,252,155 B1 | 6/2001 | Ortabasi |
| 6,440,769 B2 | 8/2002 | Peumans et al. |
| 6,653,551 B2 | 11/2003 | Chen |

(Continued)

FOREIGN PATENT DOCUMENTS

| FR | 2 327 643 | 5/1977 |
| FR | 2 417 188 | 9/1979 |

(Continued)

OTHER PUBLICATIONS

U.S. Appl. No. 12/311,988, filed Apr. 21, 2009, Nakata et al.

*Primary Examiner* — Fei Fei Yeung Lopez
(74) *Attorney, Agent, or Firm* — Jordan and Hamburg LLP

(57) ABSTRACT

In order to collect a plurality of semiconductor elements easily from a semiconductor module where a plurality of rod-like semiconductor elements for power generation or light emission are built in and to reuse or repair them, two split modules 61 are arranged in series in a containing case 62 in a semiconductor module 60. In each split module 61, power generating semiconductor elements 1 arranged in a matrix of a plurality of rows and columns, and a conductive connection mechanism for connecting the plurality of semiconductor elements 1 in each row in series and the plurality of semiconductor elements 1 in each column in parallel are molded with transparent synthetic resin, and a connection conductor 67 is allowed to project at the end. A conductive waved spring 70 and an external terminal 76 are provided on the end side of the containing case 62, and series connection of the two split modules 61 is ensured by mechanical pressing force of the conductive waved spring 70.

10 Claims, 9 Drawing Sheets

(56) References Cited

U.S. PATENT DOCUMENTS

| | | |
|---|---|---|
| 6,744,073 B1 | 6/2004 | Nakata |
| 7,205,626 B1 | 4/2007 | Nakata |
| 7,220,997 B2 | 5/2007 | Nakata |
| 7,238,966 B2 | 7/2007 | Nakata |
| 7,238,968 B2 | 7/2007 | Nakata |
| 7,244,998 B2 | 7/2007 | Nakata |
| 8,030,569 B2 * | 10/2011 | Nakata .................. 136/250 |
| 2003/0077849 A1 * | 4/2003 | Liu et al. ................. 438/31 |
| 2005/0127379 A1 * | 6/2005 | Nakata ..................... 257/84 |
| 2007/0169804 A1 | 7/2007 | Nakata |

FOREIGN PATENT DOCUMENTS

| | | |
|---|---|---|
| JP | 7-221335 | 8/1995 |
| JP | 7-335925 | 12/1995 |
| JP | 9-162434 | 6/1997 |
| JP | 2000-022184 | 1/2000 |
| JP | 2001-267609 | 9/2001 |
| JP | 2004-093602 | 3/2004 |
| WO | WO-98/15983 | 4/1998 |
| WO | WO-02/35612 | 5/2002 |
| WO | WO-02/35613 | 5/2002 |
| WO | WO-03/017382 | 2/2003 |
| WO | WO-03/017383 | 2/2003 |
| WO | WO-03/036731 | 5/2003 |
| WO | WO-03/094248 | 11/2003 |
| WO | WO-04/001858 | 12/2003 |
| WO | WO-2005/088733 | 9/2005 |

* cited by examiner

SEMICONDUCTOR MODULE FOR POWER GENERATION OR LIGHT EMISSION

TECHNICAL FIELD

The present invention relates to a semiconductor module for power generation or light emission comprising a plurality of rod-like semiconductor elements having power generation or light emission capability and electrically connected in series and in parallel for high output.

BACKGROUND TECHNOLOGY

The inventor of the present application proposed, as set forth in the International Publication No. WO98/15983, a spherical semiconductor element having light reception or light emission capability and having positive and negative electrodes at opposite portions to each other with regard to the center and a solar battery module wherein a plurality of semiconductor elements are connected in series and two or more of the series-connected semiconductor elements are embedded in a synthetic resin material. The spherical semiconductor element has a spherical pn-junction in the surface part and the positive and negative electrodes are provided at the centers of the surfaces of p-type and n-type regions, respectively.

The inventor of the present application proposed, as set forth in the International Publication Nos. WO02/35612, WO02/35613, and WO03/017382, a solar battery module wherein the above described spherical semiconductor elements are arranged in a plurality of rows and columns and the semiconductor elements in each row are connected in parallel by conductive members and solder or conductive adhesive, the semiconductor elements in each column are connected in series by lead members and solder, and they are embedded in a synthetic resin material.

The inventor of the present application proposed in the International Publication No. WO02/35612 a rod-like semiconductor element having light reception or light emission capability wherein a cylindrical semiconductor crystal has a pair of end faces perpendicular to the axis, a pn-junction is formed near the surface of the semiconductor crystal containing one end face, and positive and negative electrodes are formed on either end face. The inventor of the present application proposed, as set forth in the International Publication No. WO03/036731, a semiconductor module having light reception or light emission capability wherein a plurality of semiconductor elements are embedded in a synthetic resin material.

In the photovoltaic array described in the U.S. Pat. No. 3,984,256, an n-type diffusion layer is formed on the surface of a filament consisting of a p-type silicon semiconductor having a diameter of 0.001 to 0.010 inch and a plurality of such filaments are arranged in parallel and in a plane. A plurality of P-connection wires and N-connection wires are arranged orthogonally and alternately on the top surface of the filament. The P-connection wires are ohmic-connected to the exposed parts of the p-type silicon semiconductors of the plurality of filaments and the N-connection wires are ohmic-connected to the n-type diffusion layers of the plurality of filaments. The plurality of P-connection wires are connected to P-buses and the plurality of N-connection wires are connected to N-buses. Highly strong insulating fibers are interwoven to form a mesh structure with the plurality of P-buses and N-buses, whereby a flexible solar battery blanket receiving the incident light from above for power generation is formed.

In the semiconductor fiber solar battery and module described in the U.S. Pat. No. 5,437,736, a molybdenum conductive layer is formed on the surface of an insulating fiber and two, p-type and n-type, photovoltaic thin semiconductor layers and a ZnO conductive layer are formed on the molybdenum conductive layer around approximately $3/5$ of the periphery. A plurality of such semiconductor fiber solar batteries are arranged in parallel and in a plane, a metal coating is formed on the back, and the metal coating is partially removed in a specific pattern to form a connection circuit connecting in series the plurality of semiconductor fiber solar batteries.

Recently, solar batteries are increasingly used as a renewable, clean energy source in view of environmental issues such as air pollution and global warming and depletion of fossil fuel. Light emitting diodes are also increasingly used as an illumination source for saving energy and resources. Saving in materials and resources and less production energy consumption are becoming requirements.

Patent Document 1: International Publication No. WO98/15983;
Patent Document 2: International Publication No. WO02/35612;
Patent Document 3: International Publication No. WO02/35613;
Patent Document 4: International Publication No. WO03/017382;
Patent Document 5: International Publication No. WO03/036731;
Patent Document 6: U.S. Pat. No. 3,984,256; and
Patent Document 7: U.S. Pat. No. 5,437,736.

DISCLOSURE OF THE INVENTION

Problems to be Solved by the Invention

When spherical or nearly spherical semiconductor elements are used to constitute a solar battery panel, the light receiving area per semiconductor element is small and therefore a larger number of semiconductor elements are necessary. Consequently, there are many connection points where the semiconductor elements are electrically connected and the conductive connection mechanism has a complex structure, leading to higher production cost. This also applies to the above described rod-like semiconductor element. The rod-like semiconductor element has an increased resistance between the electrodes for a generated current when it has a larger axial length. The axial length has to be approximately 1.5 times of the diameter or smaller and the light receiving area cannot be increased so much.

The photovoltaic array described in the U.S. Pat. No. 3,984,256 uses very fine silicon fibers. It is difficult to reduce production cost because of many electric connections. Light enters from above; there is no way to receive light entering the panel from the sides. This also applies to the semiconductor fiber solar battery described in the U.S. Pat. No. 5,437,736. Particularly, it is desirable for solar battery panels applied to window panes to be able to receive light entering them from the sides. On the other hand, when a light emitting panel is constituted using semiconductor elements having light emitting capability, it is desirable that light can exit from the sides.

In many prior art solar battery modules and light emitting diode displays, a large number of granular semiconductor elements are connected to conductive members using solder or conductive adhesive and the whole structure is embedded in a transparent synthetic resin cover case (outer enclosure). Therefore, the large number of semiconductor elements cannot be removed and recovered from the cover case when the solar battery module is disposed. Hence, it is difficult to recover and reuse semiconductor elements from disposed solar battery modules and light emitting diode displays and solutions giving consideration to resources and natural environments have been sought.

After the above described semiconductor elements are in practical use on a massive scale in the near future, they will be replaced or disposed accordingly in large numbers as a result of deterioration or the end of life-span. That may be a great burden to resources and natural environments. Particularly, regulations have been imposed on the use of lead-containing solder materials in them.

The purpose of the present invention is to provide a semiconductor module for power generation or light emission that is usable as a solar battery module or light emitting diode display in which a plurality of semiconductor elements having power generation or light emission capability are installed, to provide a semiconductor module for power generation or light emission that is easy to reuse, recycle, and repair a plurality of semiconductor elements, and to provide a semiconductor module for power generation or light emission in which semiconductor elements having a large light receiving or light emitting area are installed.

Means to Solve the Problem

The semiconductor module for power generation or light emission of the present invention is a semiconductor module comprising a plurality of semiconductor elements having power generation or light emission capability characterized in that the plurality of semiconductor elements each comprise a base consisting of a p-type or n-type rod-like semiconductor crystal having a circular or partially circular cross-section, separate conductive layer formed in a surface part of the base except for a band-shaped area parallel to an axis of the base and its vicinity and having a conductive type different from that of the base, a pn-junction formed by the base and separate conductive layer in a shape of a partial cylinder, a band-shaped first electrode ohmic-connected to a surface of the base at the band-shaped area, and a band-shaped second electrode ohmic-connected to a surface of the separate conductive layer on an opposite side of the axis of the base to the first electrode; a retention means retaining the plurality of semiconductor elements in a manner that they are arranged in a plurality of columns and rows in a plane with their conducting direction aligned in a column direction and they are separable individually or in groups is provided; a conductive connection mechanism connecting in series the plurality of semiconductor elements in each column or in each two adjacent columns of the plurality of columns and connecting in parallel the plurality of semiconductor elements of each row of the plurality of rows is provided; and conductive elastic members applying mechanical pressing force in a direction parallel to the column direction are provided for maintaining the series connection of a plurality of columns of semiconductor elements by the conductive connection mechanism.

The semiconductor module uses a rod-like semiconductor element having a rod-like base, a pn-junction in the shape of a partial cylinder, and first and second electrodes provided at the ends on either side of the axis of the base, thus increasing the light receiving area or light emitting area per semiconductor element and reducing the necessary number of semiconductor elements and the number of electric connections.

The conductive connection mechanism connects in series the semiconductor elements in each column or the semiconductor elements in each two adjacent columns and connects in parallel the semiconductor elements in each row. When some semiconductor elements fail due to defects or disconnection, the current flows through an alternative path bypassing the failed semiconductor elements. All normal semiconductor elements effectively work. In a solar battery module, when some semiconductor elements are disabled because they are in shade, the current flows through an alternative path in the same manner as the above. Also in a light emitting diode display, the current flows through an alternative path in the same manner as the above. All normal semiconductor elements effectively work.

The conductive connection mechanism has conductive elastic members applying mechanical pressing force in the direction parallel to the column direction for maintaining the series connection of a plurality of columns of semiconductor elements. Therefore, electric connection by solder or conductive adhesive can be minimized or eliminated. When the semiconductor module is disposed or repaired, the retention means can be disassembled to separate the plurality of semiconductor elements individually or in groups. The plurality of semiconductor elements can be removed individually or in groups.

The following various structures can be used in addition to the above structure of the present invention.

(1) The cross-section of the base of the semiconductor element in a plane orthogonal to the axis of the base is a partial circle obtained by removing from a circle a segment of which the chord is ½ to ⅔ of a diameter in length.

(2) The band-shaped area of the base is a band-shaped flat area formed by removing the segment having the above chord.

(3) The other conductive layer is a diffusion layer formed by diffusing an impurity.

(4) The retention means has a flat containing case forming a flat containing zone containing a plurality of semiconductor elements, the containing case comprises a plurality of separable members including a pair of casing plates separating the containing zone from the surroundings on either side, and at lest one of the casing plates is made of an optically transparent glass or synthetic resin.

(5) In the above (4), the retention means has a plurality of waved retention springs arranged nearly in parallel in the containing case and each consisting of a conductive strip, the plurality of semiconductor elements in each row are retained by a pair of waved retention springs with their first and second electrodes electrically connected to them, and the conductive connection mechanism comprises the plurality of waved retention springs.

(6) In the above (5), the plurality of semiconductor elements are retained between a plurality of troughs of one of adjacent waved retention springs and a plurality of crests of the other, respectively.

(7) In the above (6), the plurality of waved retention springs form a mesh structure with the plurality of semiconductor elements being retained.

(8) In any of the above (4) to (7), the semiconductor element is a semiconductor element having power generation capability and the pair of casing plates is made of an optically transparent glass or synthetic resin.

(9) In the above (4), the plurality of semiconductor elements are divided into a plurality of groups; the plurality of semiconductor elements in each group are arranged in a matrix of a plurality of rows and columns and adjacent semiconductor elements of the plurality of semiconductor elements in each row are placed closely or at a specific interval; the conductive connection mechanism has a plurality of conductive wires provided between rows of a plurality of rows of semiconductor elements and a pair of connection conductors provided outside the rows at either end in the column direction and in parallel to a row direction; and the plurality of semiconductor elements, plurality of conductive wires, and pair of connection conductors of each group are partially embedded in an optically transparent resin to form a flat split module.

(10) In the above (9), two or more of the split modules are arranged in the containing case in series in the column direction with the connection conductors of adjacent split modules being electrically connected.

(11) In the above (10), the containing case comprises a pair of casing plates superimposed face-to-face, the casing plates each have sidewalls closing both ends of the containing zone in the row direction and terminal mounting grooves extending from the containing zone to either end of the casing plate in the column direction, and a terminal plate protruding outside is mounted in a pair of facing terminal mounting grooves of the containing case and fixed to the containing case.

(12) In the above (11), waved springs constituting the conductive elastic members are interposed between the terminal plate and the connection conductor of split module facing the terminal plate, and the elastic biasing force of the pair of waved springs serves to maintain electrical series connection of a plurality of split modules.

(13) In the above (11) or (12), the terminal plates are fixed to the containing case in the manner that their positions are adjustable in the column direction.

Advantages of the Invention

The semiconductor module for power generation or light emission of the present invention uses a rod-like semiconductor element having a rod-like base, a pn-junction in the shape of a partial cylinder, and first and second electrodes provided at the ends on either side of the axis of the base, thus increasing the light receiving area or light emitting area per semiconductor element, reducing the necessary number of semiconductor elements and the number of electric connections, reducing the production cost, and realizing a semiconductor module having high power generation or light emission capability.

A retention means retaining a plurality of semiconductor elements in the manner that they are separable individually or in groups and conductive elastic members applying mechanical pressing force in direction parallel to the column direction for maintaining the series connection of a plurality of columns of semiconductor elements by the conductive connection mechanism are provided. Therefore, when the semiconductor module is disposed or repaired, the plurality of semiconductor elements can be removed individually or in groups. The semiconductor elements can be reused, recycled, or repaired. The prior art solder or conductive adhesive connection can be eliminated or minimized.

Figure 1:
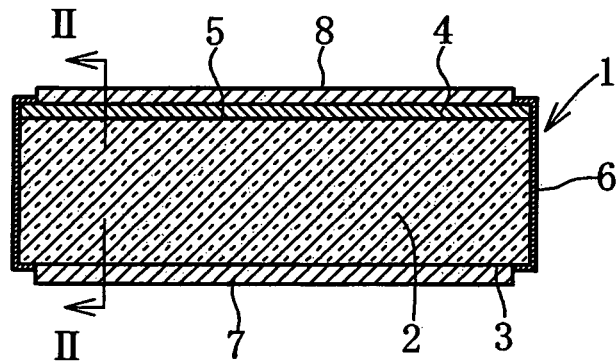
FIG. 1 is a cross-sectional view of a semiconductor element having power generation capability relating to Embodiment 1.

DESCRIPTION OF NUMERALS 1 power generating semiconductor element
1A light emitting semiconductor element
2 base
3 flat area (band-shaped area)
4 n-type diffusion layer (separate conductive layer)
5 pn-junction
6 antireflection film
7 positive electrode
8 negative electrode
20 solar battery module
21 retention mechanism
22 conductive connection mechanism
23 waved retention spring
24 containing case
25 containing zone
26 outer frame
27 casing plate
31 elastic film
60 solar battery module
61 split module
62 containing case
63 casing member
65 containing zone
66 conductive wire
70 waved spring
76 external terminal

BEST MODE FOR IMPLEMENTING THE INVENTION

The present invention relates to a semiconductor module for power generation or light emission comprising a plurality of rod-like semiconductor elements having power generation or light emission capability wherein the plurality of semiconductor elements can be separated individually or in groups when the semiconductor module is disposed or repaired.

Embodiment 1

A solar battery module of Embodiment 1 (which corresponds to the semiconductor module for power generation)

will be described with reference to FIGS. 1 to 11. First, a rod-like semiconductor element having power generation capability and applied to the solar battery module will be described.

Figure 2:
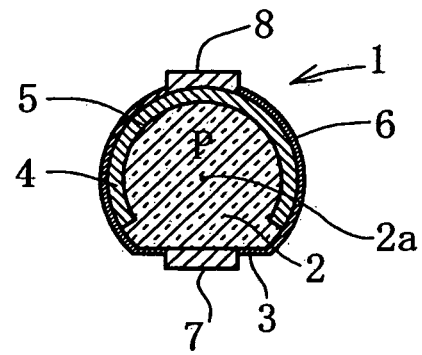
FIG. 2 is a cross-sectional view at the line II-II in FIG. 1.
Figure 3:
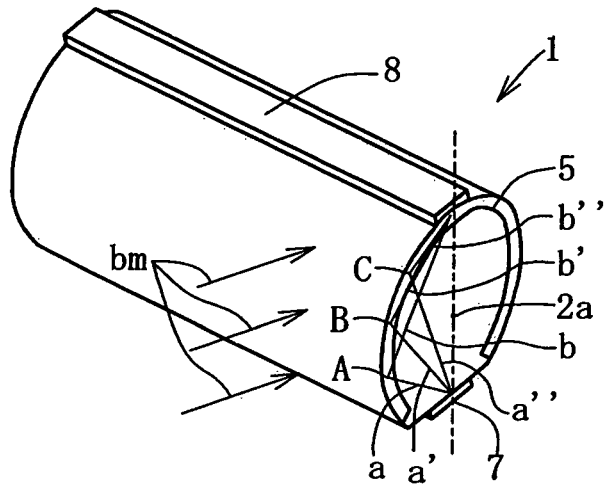
FIG. 3 is a perspective view of the semiconductor element in FIG. 1.

As shown in FIGS. 1 to 3, a rod-like semiconductor element 1 has a rod-like base 2 consisting of a p-type silicon monocrystal, a flat area 3 formed on the base 2 in the shape of a band or strip parallel to the axis of the base 2, an n-type diffusion layer 4, a pn-junction 5 formed by the base 2 and diffusion layer 4 in the shape of a partial cylinder, an antireflection film 6, a positive electrode 7 ohmic-connected to the base 2, and a negative electrode 8 ohmic-connected to the n-type diffusion layer 4.

The cross-section of the base 2 in a plane orthogonal to the axis 2a is of a partial circle obtained by removing from the circle (for example having a diameter of 1.8 mm) a segment of which the chord is ½ to ⅔ of the diameter in length. The base 2 has an axial length of for example 5 to 20 mm. The base 2 has at the bottom a flat area 3 in the shape of a band or strip extending over the entire length in parallel to the axis 2a and having a width of for example 0.6 mm (which corresponds to the band-shaped area). The flat area 3 serves as a reference surface for positioning the base 2, a surface for preventing the base 2 from turning over, and a reference surface for distinguishing between the positive and negative electrodes 7 and 8.

The n-type diffusion layer 4 (which corresponds to the separate conductive layer) consists of an n-type semiconductor having a conductivity type different from that of the base 2. The n-type diffusion layer 4 is formed in the shape of a partial cylinder close to a cylinder by thermal-diffusing an n-type impurity such as phosphorus (P), arsenic (As), and antimony (Sb) in the surface part of the base 2 to a depth of 0.5 to 1.0 μm except for the flat area 3 and its vicinity on either side. The pn-junction 5 is formed in the shape of a partial cylinder close to a cylinder near the boundary between the base 2 and n-type diffusion layer 4.

The positive electrode 7 (which corresponds to the first electrode) is formed at the center of the flat area 3 in the shape of a band or strip extending over the entire length of the base 2 and having a width of for example 0.4 mm, and is electrically connected to the base 2. The positive electrode 7 is formed by applying and firing a positive electrode material consisting of a silver-containing paste. The negative electrode 8 (which corresponds to the second electrode) is formed on the surface of the n-type diffusion layer 4 at a position opposite to the positive electrode 7 with regard to the axis 2a of the base 2 in the shape of a band or strip extending over the entire length of the base 2 and having a width of for example 0.4 mm, and is electrically connected to the n-type diffusion layer 4. The negative electrode 8 is formed by applying and firing a negative electrode material consisting of an aluminum-containing paste.

The antireflection film 6 consisting of a silicon oxide coating or silicon nitride coating and serving as a passivation film on the surface of the semiconductor element 1 is formed on the exposed surface of the base 2 and n-type diffusion layer 4 except for the areas where the positive and negative electrodes are formed.

In this semiconductor element 1, the area of the pn-junction 5 is much larger than the cross-sectional area of the base 2 in a plane orthogonal to the axis 2a. FIG. 3 is a perspective view of the semiconductor element 1 seen from above. With sunlight bm entering the surface of the semiconductor element 1 except for the areas where the positive and negative electrodes 7 and 8 are formed and being absorbed by the silicon monocrystal of the base 2, carriers (electrons and holes) are generated and the pn-junction 5 separates electrons from holes and approximately 0.5 to 0.6 V of photovoltaic power is generated between the positive and negative electrodes 7 and 8.

The semiconductor element 1 has a rod-like shape close to a cylinder. The positive and negative electrodes 7 and 8 are provided on either side of the axis 2a of the base 2; the positive electrode 7 is placed at the center of the p-type surface of the flat area 3 and the negative electrode 8 is placed at the center of the n-type surface of the diffusion layer 4. Therefore, light is received symmetrically about the plane connecting the positive and negative electrodes 7 and 8. Sunlight in a wide range of directions can be absorbed on either side of the plane with high light reception sensitivity. The light reception sensitivity does not drop as the incident light direction changes.

As shown in FIG. 3, for carriers generated at different positions A, B, and C in the circumferential direction on any plane orthogonal to the axis 2a of the base 2 as a result of the silicon monocrystal of the base 2 receiving sunlight, the sum of the distances to the positive and negative electrodes 7 and 8 is nearly equal, namely $(a+b) \approx (a'+b') \approx (a''+b'')$. Then, the photoelectric current distribution is uniform with regard to the axis 2a of the base 2 and resistance loss due to uneven distribution can be reduced. Here, the pn-junction 5 is covered with and protected by the insulating antireflection film 6 at the periphery and at the end faces orthogonal to the axis 2a.

The semiconductor element 1 has the positive and negative electrodes 7 and 8 in the shape of bands formed on the surface of the rod-like base 2 at opposite positions to each other with regard to the axis 2a. Even if the base 2 has a large length/diameter ratio, the distance between the positive and negative electrodes 7 and 8 can be maintained smaller than the diameter of the base 2. Therefore, the electric resistance between the positive and negative electrodes 7 and 8 can be maintained small and the photoelectric conversion performance of the pn-junction 5 can be maintained high.

Consequently, when a solar batter module is constituted using a large number of semiconductor elements 1, the base 2 having a larger length/diameter ratio can contribute to reducing the necessary number of semiconductor elements 1, reducing the number of electric connections, increasing the reliability of the solar battery module, and reducing production cost. The light reception symmetric about the plane containing the positive and negative electrodes 7 and 8 allows for a solar battery module that can receive light on both sides.

The base 2 has the flat area 3, which serves as a reference surface in the course of production of the semiconductor element 1, prevents the base 2 from turning over, and allows for example a sensor of an automated assembly apparatus to distinguish between the positive and negative electrodes 7 and 8. The antireflection film 6 on the surface of the semiconductor element 1 reduces reflection of incident light and increases the light reception rate. The antireflection film 6 also serves as a passivation film, protecting the surface of the semiconductor element 1 and ensuring its durability.

A solar battery module 20 constituted by a large number of semiconductor elements 1 connected in series and in parallel will be described hereafter with reference to FIGS. 4 to 11.

The solar battery module 20 is a double glass solar battery module. The solar battery module 20 has a rectangular light receiving surface of for example 50 to 75 mm on a side. This light receiving surface size is given by way of example. Larger solar battery modules can be constituted.

Figure 4:
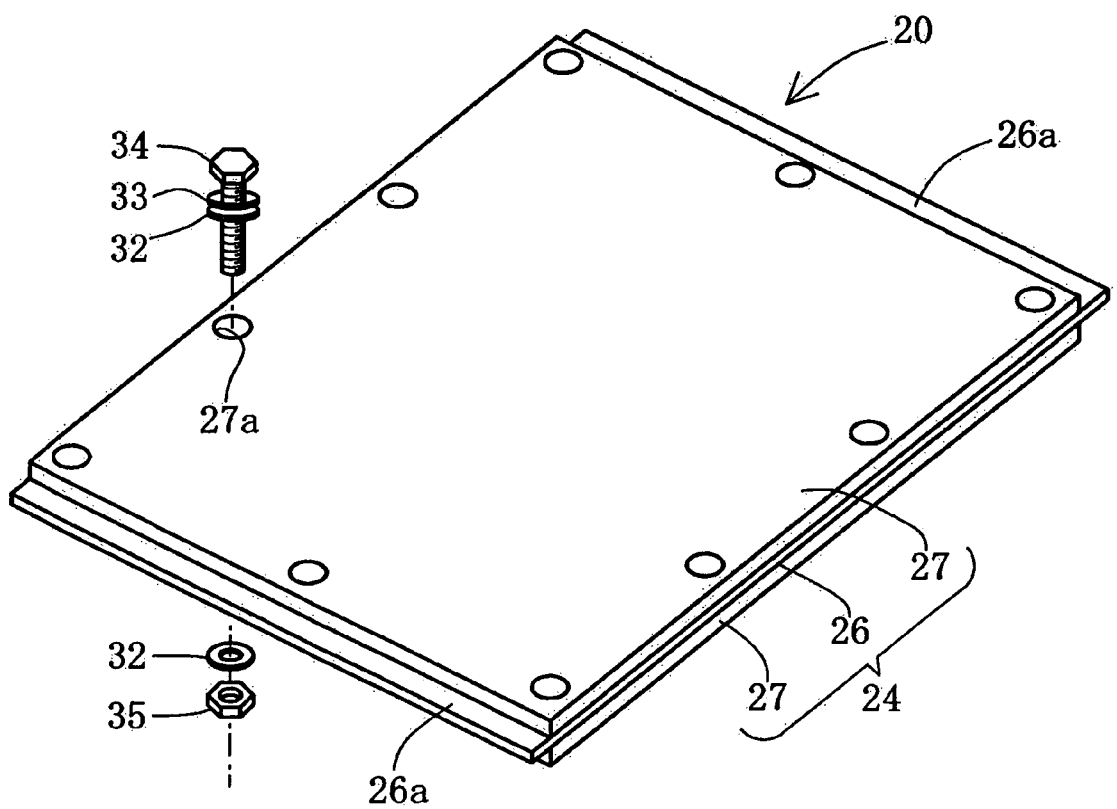
FIG. 4 is a perspective view of a solar battery module of Embodiment 1.
Figure 5:
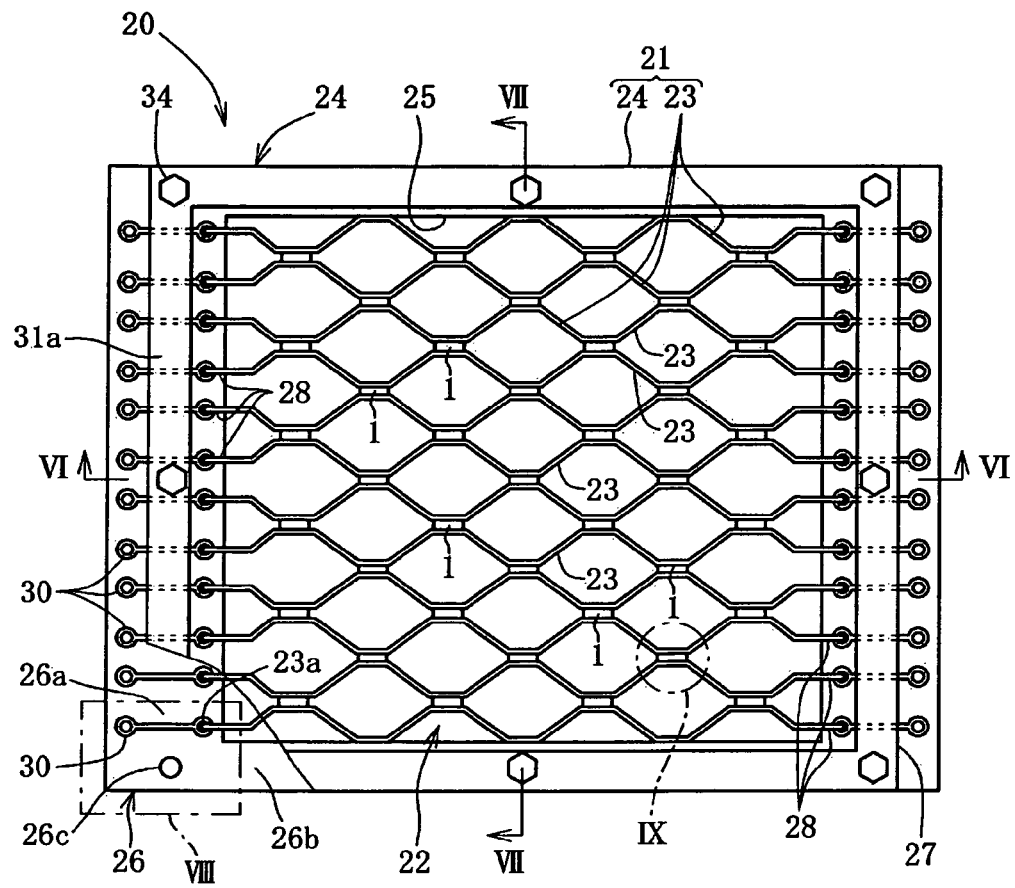
FIG. 5 is a plane view of the solar battery module in FIG. 4.
Figure 6:
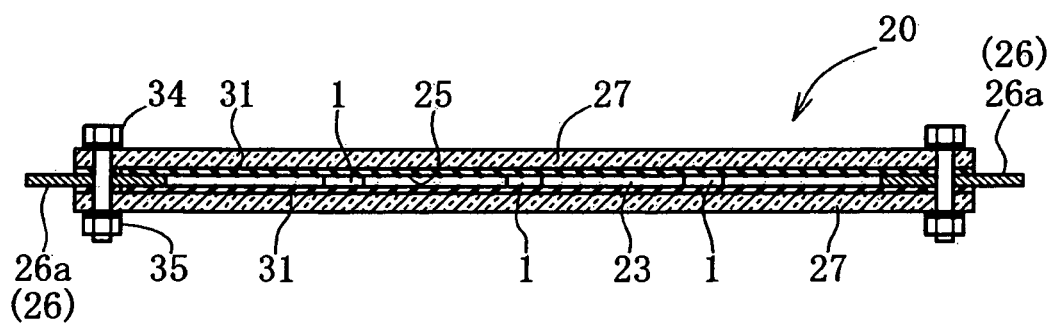
FIG. 6 is a cross-sectional view at the line VI-VI in FIG. 5.
Figure 7:
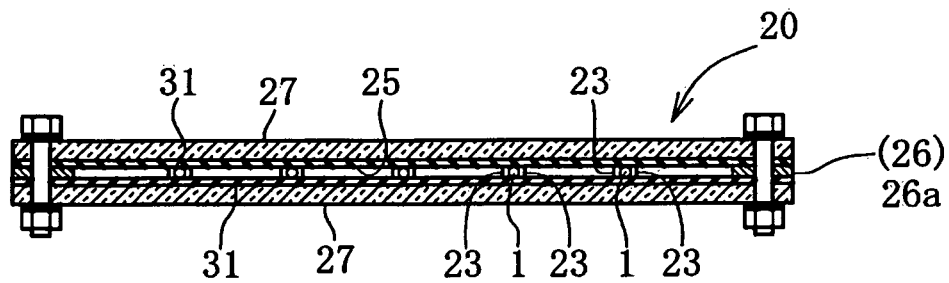
FIG. 7 is a cross-sectional view at the line VII-VII in FIG. 5.

As shown in FIGS. 4 and 5, the solar battery module 20 comprises a retention mechanism 21 (the retention means) retaining a plurality of semiconductor elements 1 in the manner that they are arranged in a plurality of columns and rows in a plane with their conducting direction aligned in the column direction and they are separable individually or in groups, a conductive connection mechanism 22 connecting in series the plurality of semiconductor elements 1 in each two adjacent columns of the plurality of columns and connecting in parallel the plurality of semiconductor elements 1 in each row of the plurality of rows, and a plurality of conductive waved retention springs 23 serving as conductive elastic members applying mechanical pressing force in the direction parallel to the column direction for maintaining the series connection of a plurality of semiconductor elements 1 by the conductive connection mechanism.

The retention mechanism 21 comprises a flat containing case 24 and a plurality of conductive waved retention springs 23. The conductive connection mechanism 22 comprises the plurality of waved retention springs 23. A flat, rectangular containing zone 25 is formed in the containing case 24 to contain the plurality of semiconductor elements 1. The containing case 24 has an outer frame 26 surrounding the containing zone 25 and transparent glass casing plates 27 closing the top and bottom of the containing zone 25 and outer frame 26.

The outer frame 26 is a rectangular frame made of an insulating member (a printed wiring board) made of glass fibers and an epoxy resin and having a thickness of approximately 2 mm. The outer frame 26 has at the right and left ends in FIG. 5 vertical frame parts 26a extending beyond the ends of the casing plates 27.

Figure 8:
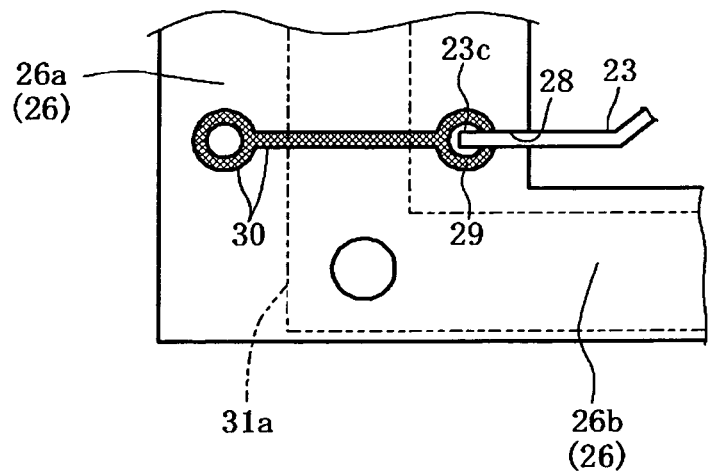
FIG. 8 is an enlarged view of a part marked by VIII in FIG. 5.
Figure 9:
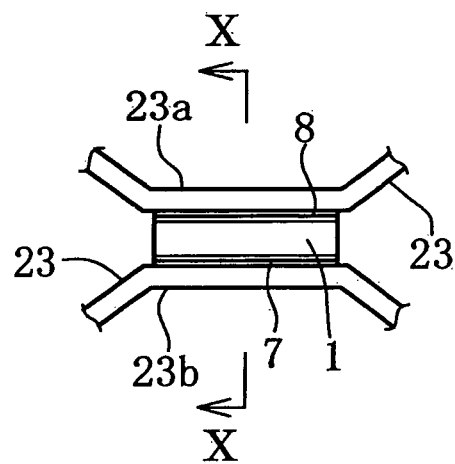
FIG. 9 is an enlarged view of a part marked by IX in FIG. 5.
Figure 10:
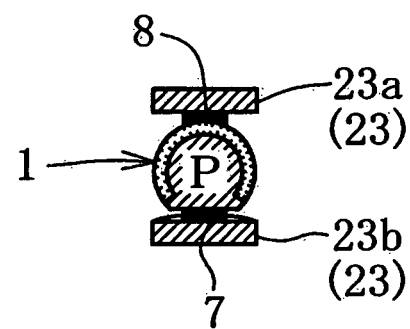
FIG. 10 is a cross-sectional view at the line X-X in FIG. 9.

As shown in FIGS. 5 and 8, the right and left vertical frame parts 26a have a plurality of slot/pore sets 28 to couple the coupling parts 23c at the ends of the waved retention springs 23. A conductive layer 29 consisting of a silver-coated copper foil is formed on the inner surface of the slot/pore set 28. The conductive layer 29 is electrically connected to the coupling part 23c of the waved retention spring 23. The right and left vertical frame parts 26a has a plurality of lead connection parts 30 corresponding to the plurality of slot/pore sets 28. Each lead connection part 30 consists of a silver-coated copper foil and electrically connected to the conductive layer 29 of the corresponding slot 28.

As shown in FIGS. 5 to 10, a plurality of waved retention springs 23 are provided in the containing zone 25 in the manner that they are nearly in parallel and the troughs 23a and crests 23b of adjacent waved retention springs 23 closely face each other. The end and leading coupling part 23c of each waved retention spring 23 is fitted in a slot/pore 28 of the vertical frame part 26a, whereby the waved retention spring 23 is coupled to the vertical frame part 26a. The waved retention spring 23 is formed by shaping a band or strip phosphor bronze plate having a thickness of approximately 0.4 mm and a width of approximately 1.9 mm in a periodic wave pattern and silver-plating the surface.

A plurality of semiconductor elements 1 are arranged in a plurality of columns and rows with their conducting direction aligned in the column direction in the containing zone 25. The plurality of semiconductor elements 1 in two adjacent columns are arranged in a zigzag pattern. The semiconductor elements 1 are placed in positions where the troughs 23a and crests 23b of adjacent waved retention springs 23 closely face each other. The positive electrode 7 of each semiconductor element 1 is bonded and electrically connected to the waved retention spring 23 using a conductive epoxy resin. The negative electrode 8 of each semiconductor element 1 is pressed against and electrically connected to the waved retention spring 23 through the elastic pressing force from the waved retention spring 23. Abutting against the inner surfaces of the horizontal frame parts 26b of the outer frame 26, the waved retention springs 23 at the ends in the column direction are in place.

A number of rod-like semiconductor elements 1 are retained by mechanical pressing force from a plurality of conductive waved retention springs 23 and electrically connected in the containing zone 25. The plurality of semiconductor elements 1 in each two adjacent columns of the plurality of columns are electrically connected in series by the plurality of waved retention springs 23 and the plurality of semiconductor elements 1 in each row are electrically connected in parallel by a pair of waved retention springs 23 on either side thereof. The conductive connection mechanism 22 comprises the plurality of waved retention springs 23. The mechanical pressing force applied by the plurality of waved retention springs 23 in the column direction maintains the series connection of the plurality of columns of semiconductor elements 1.

The transparent casing plates 27 are attached to the top and bottom of the outer frame 26 and containing zone 25 to seal the containing zone 25. The casing plate 27 (for example having a thickness of approximately 3 mm) has an elastic film 31 made of a transparent silicone rubber having a thickness of approximately 0.2 mm on one surface (on the inner surface). The pair of casing plates 27 sandwiches a set of semiconductor elements 1 and the outer frame 26 in the manner that their elastic films 31 makes contact them. The elastic film 31 has at the periphery an elastic film frame 31a having an increased thickness of approximately 0.5 mm for improved sealing against the outer frame 26. The bolt holes 27a of the casing plate 27 and the bolt holes 26c of the outer frame 26 are aligned and steel bolts 34 and nuts 35 are fastened with synthetic resin (for example fluorocarbon resin) washers 32 and steel disc springs 33 for sealing.

Here, the end waved retention springs 23 adjacent to the horizontal frame parts 26b of the outer frame 26 are in mechanical contact with and retained by the inner surfaces of the horizontal frame parts 26b through the pressing force of the waved retention springs 23. However, the integration is not necessarily achieved by fastening the bolts 34 and nuts 35. Any structure that allows the casing plates 27, outer frame 26, and plurality of waved retention springs 23 to which a plurality of semiconductor elements 1 are attached to be individually separable can be used.

The containing zone 25 can be vacuumed in a vacuumed container before the bolts 34 are fastened where necessary. Then, the vacuumed containing zone 25 is sealed by fastening the bolts 34 and nuts 35. Alternatively, an inert gas such as nitrogen gas can be introduced in the containing zone 25 before it is sealed. In this way, a highly heat-insulated double glass solar battery module 20 can be obtained. To this end, the containing zone 25 preferably has a hermetically sealed structure.

As described above, a plurality of semiconductor elements 1 are retained between the two casing plates 27 by the outer frame 26 and plurality of waved retention springs 23. The plurality of waved retention springs 23 retaining the plurality of semiconductor elements 1 form a mesh structure, creating proper openings for natural lighting and proper spaces. Therefore, the double glass solar battery module 20 is usable as a highly heat-insulated and sound-insulated lighting window.

The waved retention springs 23 and semiconductor elements 1 also serve as a spacer to keep a certain distance between the two casing plates 27, thus improving the mechanical strength. A low-E double glass structure in which the surfaces of the casing plates 27 are coated with an infrared-reflecting film such as silver and tin oxide can be used for obtaining an improved heat-insulated window.

The double glass solar battery module 20 can be used alone or in combination with other solar battery modules 20 having the same structure to increase the size and accordingly the output by electrically connecting them using the lead connection parts 30. For example, when a plurality of solar battery modules 20 are connected in parallel, they can be connected using all lead connection parts 30 of at least one of the vertical frame parts 26a. When a plurality of solar battery modules 20 are connected in series, they can be connected using the lead connection parts 30 at both ends or at one end in the column direction.

In the double glass solar battery module 20, incident light transmitted through the transparent casing plates 27 is absorbed by the rod-like semiconductor elements 1 and electric power according to the intensity of light energy can be generated. During this process, not only direct light but also light multiple-reflected by the waved retention springs 23, casing plates 27, and semiconductor elements 1 within the containing zone 25 is finally absorbed by the semiconductor elements 1 and converted to electric power. The layout of a plurality of solar battery modules 20 and the shape of the waved retention springs 23 can be modified to alter the natural lighting rate and external appearance for use in windows.

Figure 11:
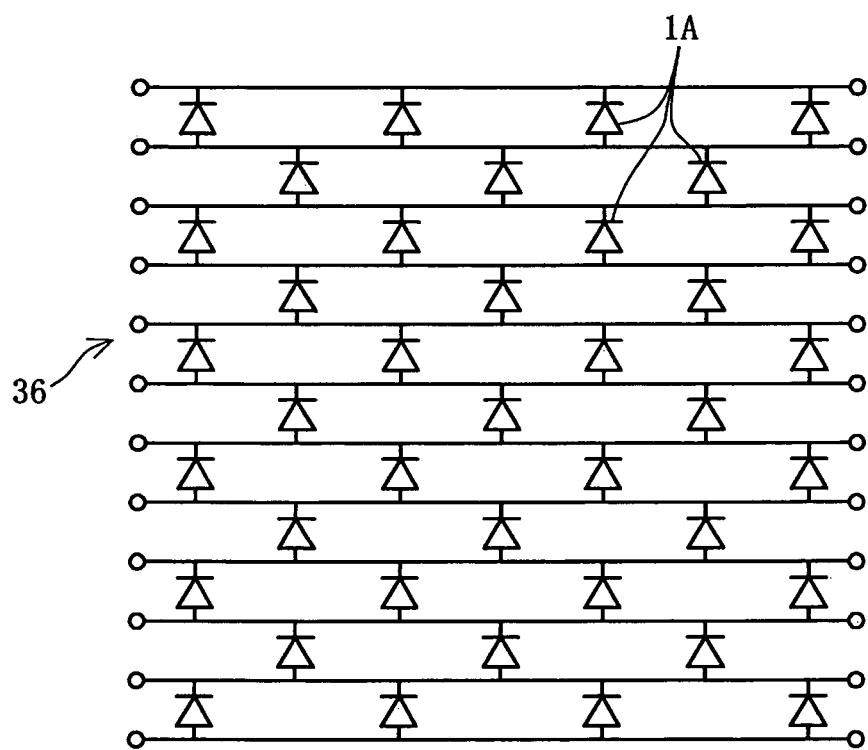
FIG. 11 is an equivalent circuit diagram to the solar battery module.
Figure 12:
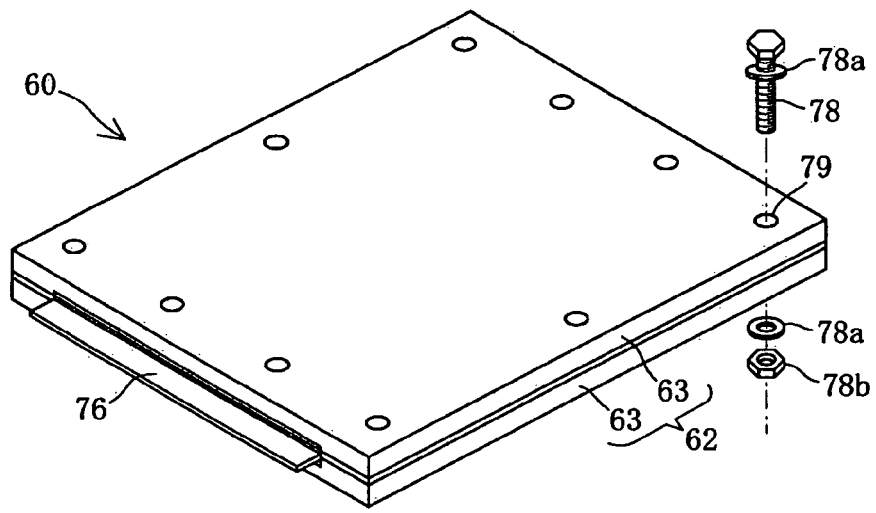
FIG. 12 is a perspective view of a solar battery module of Embodiment 2.

In the double glass solar battery module 20, a plurality of semiconductor elements connected in parallel by a pair of waved retention springs 23 are connected in series to form a mesh-structured electric circuit 36 as shown in FIG. 11. The electric circuit 36 is a equivalent circuit to the solar battery module 20 and the semiconductors 1 are presented by diodes 1A. Therefore, when some semiconductor elements 1 are open due to failure or some semiconductor elements 1 are electrically disconnected or some semiconductor elements 1 are disabled because they are in shade, the electric current flows through an alternative path bypassing the failed semiconductor elements 1, whereby all other normal semiconductor elements 1 do not lose or reduce the power generation capability.

Effects and advantages of the above described solar battery module 20 will be described hereafter.

(1) The rod-like semiconductor elements 1 each have the positive and negative electrodes 7 and 8 on either side of the axis thereof. Therefore, if the semiconductor element 1 has an axis length two or more time larger than the diameter, the resistance between the electrodes for a generated current is constant. Then, this allows for increasing the length/diameter ratio, increasing the light receiving area, reducing the necessary number of semiconductor elements, reducing the number of electric connections, reducing the production cost, and realizing a semiconductor module 20 having a high power generation capability.

(2) The rod-like semiconductor elements 1 are mechanically strong. Therefore, they can well be electrically connected to the waved retention springs 23 by the pressing force of the waved retention springs 23. Then, the solar battery module 20 can be disassembled simply by unfastening the bolts 34 and nuts 35, whereby the plurality of semiconductor elements 1 (a set of semiconductor elements) attached to the waved retention springs 23 can easily be removed together with the waved retention springs 23 and so do the other parts. The plurality of semiconductor elements 1 removed together with the waved retention springs 23 can be reused as they are together with the waved retention springs 23 or separated from the waved retention springs 23 by melting the conductive adhesive. In this way, the recovery cost of semiconductor elements 1 can be much lower than the prior art where the semiconductor elements 1 are connected firmly using solder.

(3) The outer frame 26, plurality of waved retention springs 23, and two casing plates 27 are mechanically assembled using bolts and nuts. Therefore, the solar battery module 20 can easily be assembled/disassembled, leading to significantly reduced assembly/disassembly cost.

(4) With the semiconductor elements 1 and waved retention springs 23 being held between the two transparent casing plates 27, the solar battery module 20 is highly mechanically strong and usable as a window material. Windows excellent in appearance can be obtained by well designing the layout of semiconductor elements 1 and the shapes and sizes of the waved retention springs 23, outer frame 26, and casing plates 27. A light-reflecting curtain can be provided on the inner side of the window to reflect light from outside and illuminate the back of the semiconductor elements for improved power generation.

(5) When the solar battery module 20 is used as a wall or roof material besides the solar battery, the inner one of the two casing plates 27 can have a high reflectance coating on the inside surface or the inner casing plate 27 can be replaced with a highly reflective ceramic casing plate. When a ceramic plate is used, advantages include high mechanical strength and heat insurance although no natural lighting is available.

(6) The silicone rubber film 31 (the elastic film) effectively seals the clearance between the casing plate 27 and outer frame 26 and maintains the airtight state. When an inner gas is introduced or a vacuumed state is created, the silicone rubber film 31 is effective in preventing the semiconductor elements from deteriorating due to the ambient air or in improving the heat insulation of the double glass. The silicone rubber film 31 can be a film of other elastic transparent synthetic resins (such as EVA and PET).

Partial modifications of the above described solar battery module 20 will be described hereafter.

[1] The diameter of the base 2 of the semiconductor element 1 is not restricted to 1.8 mm. The diameter is desirably in a range from 1.0 to 2.0 mm; however, it is not restricted to this range. The width of the flat area 3 of the base 2 is not restricted to 0.6 mm and desirably approximately ½ to ⅔ of the diameter of the base 2.

The semiconductor material of the base 2 is not restricted to a p-type silicon monocrystal and can be a p-type silicon polycrystal or other known semiconductors. The base 2 is not necessarily a p-type semiconductor and can be an n-type semiconductor. In such a case, the diffusion layer 4 forming a pn-junction together with the base 2 is a p-type semiconductor. In place of the diffusion layer 4, separate conductive layer (the separate conductive layer having a conductivity type different from that of the base 2) formed by CDV deposition or ion implantation can be used.

[2] The flat area 3 formed on the base 2 of the semiconductor element 1 is not essential for power generation. The flat area 3 can be eliminated. Then, the base 2 is circular in cross-section. A band-shaped area parallel to the axis where neither the diffusion layer 4 nor the pn-junction 5 is formed is created on the surface of the base 2. A band of positive electrode 7 is provided on the band-shaped area at a position symmetric to the negative electrode 8 about the axis of the base and ohmic-connected to the base 2.

[3] The outer frame 26 can comprise other materials such as ceramic wiring boards besides the above described epoxy resin printed wiring board. Ceramic wiring boards are expensive, but are fire resistant and excellent in mechanical strength and dimensional stability.

[4] The positive electrode 7 of the semiconductor element 1 can electrically connected to the waved retention spring 23 by pressing it using the elastic pressing force of the waved retention spring 23 without bonding it to the waved retention spring 23 using a conductive epoxy resin. In such a case, the semiconductor elements 1 can be removed individually when the solar battery module 20 is disassembled.

[5] One of the transparent casing plates 27 can have a reflecting film to reflect incident light for improved power generation by the semiconductor elements 1. One or both of the two glass casing plates 27 can be replaced with a synthetic resin plate such as a transparent acrylic resin, polycarbonate resin, or silicone resin plate.

[6] The material of the waved retention springs 23 can be a known spring material such as carbon steel, tungsten steel, nickel steel, nickel silver, and beryllium copper or can be a piano wire.

[7] Circuit parts such as semiconductor elements or semiconductor chips other than the power generating semiconductor elements 1, resistors, capacitors, and inductors can be mounted on the outer frame 26 to constitute a complex electronic function module or apparatus containing the semiconductor elements 1. For example, a circuit to convert the direct current output of the solar battery module 20 to alternate current output and an output control circuit can be mounted. Furthermore, LEDs and batteries can be mounted other than the semiconductor elements 1 to constitute a display device in which the LEDs use the generated power to emit light. Alternatively, hybrid devices of the solar battery module and other functional apparatuses are available by installing optical communication light source LEDs or sensor elements and IC chips for external transmission of information.

[8] A light emitting diode module usable as a display or a surface light emitting illumination lamp can be constituted by replacing the above described semiconductor elements 1 with rod-like light emitting diode elements.

Embodiment 2

A solar battery module 60 of Embodiment 2 will be described with reference to FIGS. 12 to 17.

The solar battery module 60 is designed to integrate/disintegrate a plurality of power generating semiconductor elements 1 in groups, wherein a plurality of semiconductor elements 1 are divided for example into two groups to constitute two small flat split modules 61 and the two split modules 61 are installed and connected in series in a containing case 62. The semiconductor elements 1 themselves are the same with semiconductor elements 1 in Embodiment 1 and the explanation will be made using the same reference numbers.

As shown in FIGS. 12 to 15, the solar battery module 60 comprises two split modules 61 and a containing case 62 forming a flat containing zone 65 containing the two split modules 61. The split modules 61 are formed by fixing a plurality of semiconductor elements 1 arranged in a matrix of a plurality of rows and columns to a plurality of conductive wires 66 using a conductive adhesive to connect them in series and in parallel and molding the entire structure in a synthetic resin material 61a to form a flat body. The retention means retaining the plurality of semiconductor elements 1 in the manner that they are arranged in a plurality of columns and rows in a plane and they are separable in groups comprises the synthetic resin material 61a of the split module 61 and the containing case 26.

The split modules 61 are arranged in series in the containing zone 65 of the containing case 62 and electrically connected to each other by the mechanical pressure from a pair of waved springs 70 (the conductive elastic members). In this embodiment, the solar battery module 60 having two split modules 61 is explained by way of example. However, the number of split modules installed in the containing case 62 is not restricted to two. The solar battery module 60 can have larger output as the number of split modules 61 is increased.

The above described split module 61 will be described hereafter.

Figure 13:
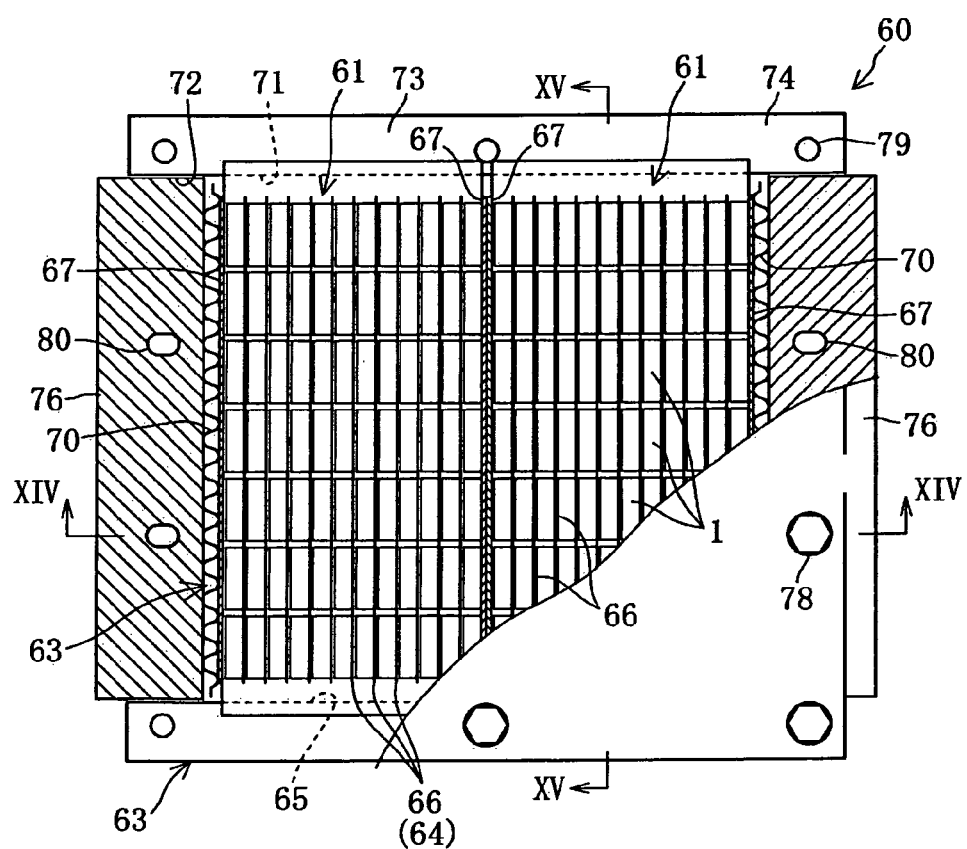
FIG. 13 is a cross-sectional plane view of the solar battery module in FIG. 13.
Figure 16:
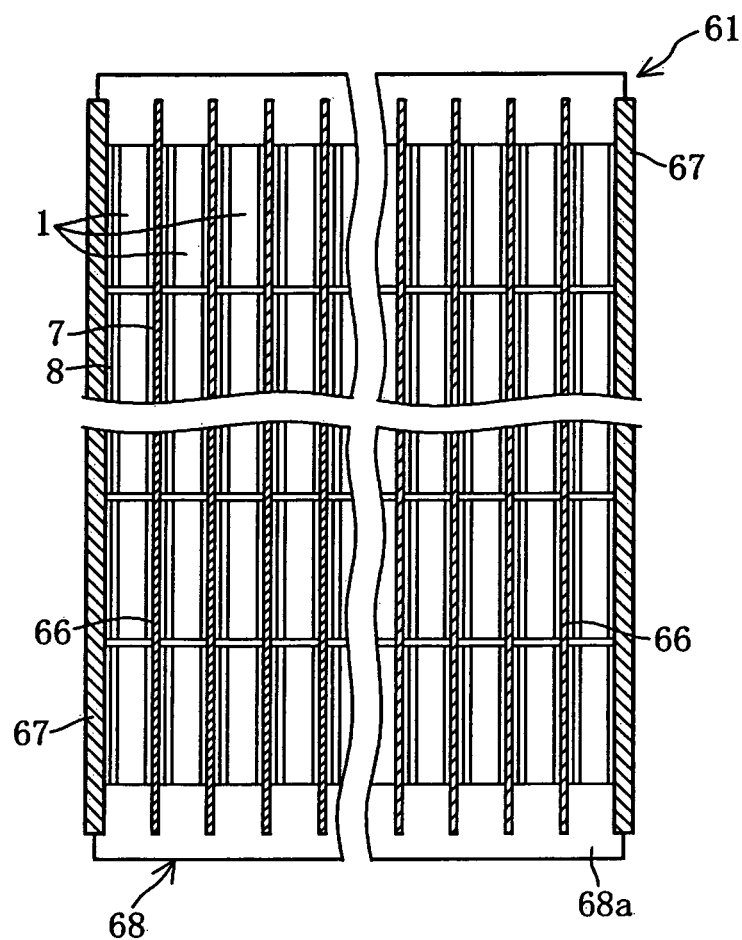
FIG. 16 is a plane view of a split module.

As shown in FIGS. 13 and 16, a plurality of semiconductor elements 1 are arranged in a matrix of a plurality of rows and columns with their conducting direction aligned in the column direction (the transversal direction in FIGS. 13 and 16). Adjacent semiconductor elements 1 in each row are slightly spaced.

Fine conductive wires 66 having a rectangular cross-section are provided between adjacent rows of a plurality of semiconductor elements 1 and abut against their positive and negative electrodes 7 and 8. Connection conductors 67 having a rectangular cross-section larger than the conductive wires 66 are provided to abut against the positive electrodes 7 or negative electrodes 8 of a plurality of semiconductor elements 1 in an either end row in the column direction. The positive and negative electrodes 7 and 8 of semiconductor elements 1 are bonded to the conductive wire 66 or connection conductor 67 using a known conductive adhesive (for example a silver epoxy resin) and heat-cured for firm fixing.

In this way, the plurality of semiconductor elements 1 in each row are connected in parallel by a pair of conductive wires 66 or a conductive wire 66 and a connection conductor 67 and the plurality of semiconductor elements 1 in each column are connected in series by the plurality of conductive wires 66. The plurality of semiconductor elements 1 of the split module 61 are connected in series and in parallel by the plurality of conductive wires 66 and two connection conductors 67. In this way, the split module 61 has a conductive connection mechanism 64 connecting in series the plurality of semiconductor elements in each column and connecting in parallel the plurality of semiconductor elements 1 in each row. The conductive connection mechanism 64 comprises the plurality of conductive wires 66 provided to the split module 61. The conductive connection mechanism of the semiconductor module 60 comprises two conductive connection mechanisms 64 of two split modules 61 and two connection conductors 67 connecting in series the two split modules 61.

The plurality of semiconductor elements 1 connected in series and in parallel, conductive wires 66, and connection conductors 67 are entirely molded in a transparent synthetic resin (for example silicone resin) to form a flat body with the edges of the connection conductors 67 being exposed from the either end of the synthetic resin plate 68. The synthetic resin plate 68 has flat retention parts 68a at either end in the row direction.

Figure 14:
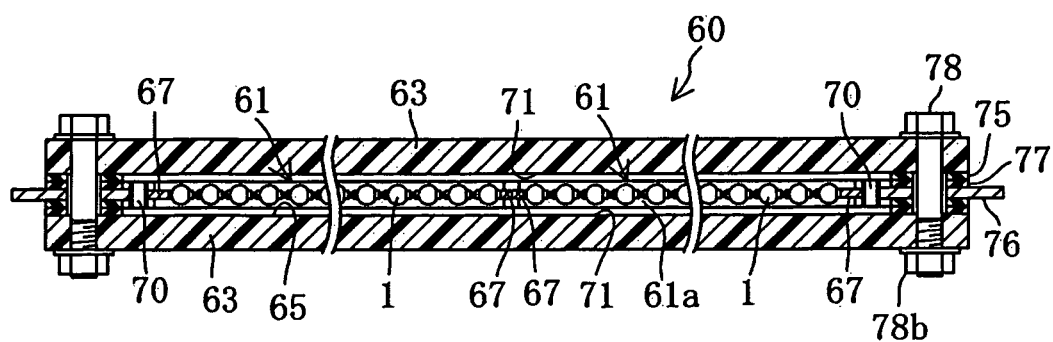
FIG. 14 is a cross-sectional view at the line XVI-XVI in FIG. 13.
Figure 15:
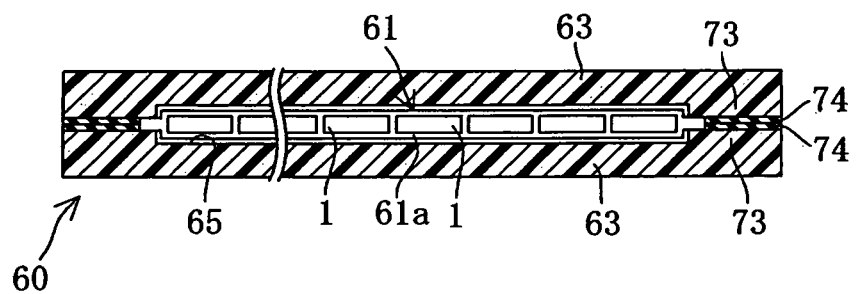
FIG. 15 is a cross-sectional view at the line XV-XV in FIG. 13.

A solar battery module 60 in which the above described two split modules 61 are installed will be described hereafter with reference to FIGS. 13 to 15. The containing case 62 is made of a transparent synthetic resin such as polycarbonate resin, acrylic resin, and silicone resin. The containing case 62 is formed by superimposing and bolting a pair of, top and bottom, casing members 63 having the same structure face-to-face. The casing members 63 each have a recess 71 forming approximately one half of the containing zone 65 and terminal mounting grooves 72 continued from either end of the recess 71 in the column direction.

The casing member 63 has a pair of lands 73 (sidewalls) outside the recess 71. Approximately outer two thirds of the surface of the land 73 is covered with an elastic rubber, for example silicone rubber, coating 74 (for example having a thickness of 0.5 to 0.8 mm). The terminal mounting groove 71 also has the same rubber coating 75 on the inner surface.

When the solar battery module 60 is assembled, the two split modules 61 are housed in the recess 71 of the bottom casing member 63 and covered with the top casing member 63, whereby the retention parts 68a of the split modules 61 at the ends in the row direction are interposed between the top and bottom lands 73.

Then, waved springs 70 and conductive external terminals 76 are inserted in the flat terminal mounting openings consisting of the top and bottom terminal mounting grooves 72 at the ends in the column direction and rubber packing 77 is inserted between the external terminal 76 and containing case 62. Then, the top and bottom casing members 63 are bolted and so do the top/bottom casing member and external terminals 76. Here, for example, bolts 78 are inserted in bolt holes 79 and 80 with fluorocarbon resin washers 78a and fastened to nuts 78b with underside fluorocarbon resin washers 78a.

Here, the bolt holes 80 of the external terminals 76 are elongated in the column direction. Therefore, the bolt holes 80 can be used to adjust the fastening position of the external terminals 76 so that the waved springs 70 apply proper pressing force. In this way, the connection conductors 76 are in mechanical contact at the center of the solar battery module 60 and the two split modules 61 are electrically connected in series. The ends of the two split modules 61 are in mechanical contact with and electrically connected to the external terminals 76 via the waved springs 70. Protruding at the ends of the containing case 62, the external terminals 76 serve as the positive and negative electrode terminals of the solar battery module 60. The power output can be retrieved from these positive and negative electrode terminals.

Figure 17:
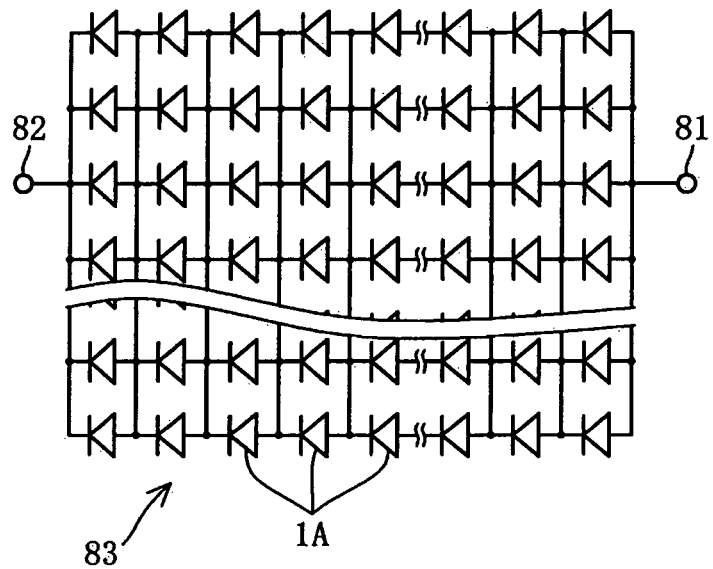
FIG. 17 is an equivalent circuit diagram to the solar battery module.

FIG. 17 is an equivalent circuit 83 to the mesh structure of the solar battery module 60. The semiconductor elements 1 are presented by diodes 1A. The equivalent circuit 83 has the same effect as the equivalent circuit 36 of Embodiment 1. The electric power can be retrieved from the positive and negative electrode terminals 81 and 82. Resin or rubber sealing members can be used to fill the clearance so as to seal the space where the split modules 61 are housed and block the ambient atmosphere.

In the solar battery module 60, two split modules 61 are mechanically connected in series by the waved springs 70 in a common containing case 62; their positions are secured by fastening the bolts 78 and nuts 78b and the rubber coatings 74 and 75 and packing 77 block the ambient air. The entire containing case 62 can be disassembled to replace or recover the split modules 61 for reuse. In this module 60, the space within the containing case 62 has heat-insulation effect. If the casing members 63 are made of a synthetic resin, they are lighter, less breakable, and inexpensive compared with glass ones. If the semiconductor elements 1 are provided at a lower density, gaps are created and light is allowed to pass, whereby natural lighting is available when the module is used as a window.

Effects and advantages of the above described solar battery module will be described hereafter.

(1) The elongated rod-like semiconductor elements 1 allow for increasing a large length/diameter ratio of the semiconductor elements 1, increasing the light receiving area per semiconductor element 1, reducing the necessary number of semiconductor elements 1, and reducing the number of electric connections, thereby reducing the production cost. The rod-like power generating semiconductor elements 1 allow for effective use of incident light in various directions for power generation. One or a plurality of solar battery modules 60 can be constituted as a window panel. In such a case, light from the room can also be used for power generation.

(2) The connection between the split modules 61 and the connection between the split module 61 and external terminal 76 are made by the mechanical pressing force of the waved springs 70. There is no need of fixing by a bonding material such as solder. The split modules 61, external terminals 76, and waved springs 70 can easily be removed from the solar battery module 60 to use them for another solar battery module. Here, a plurality of solar battery modules 60 can easily be connected in series by contacting their external terminals 76.

(3) The conductive waved springs 70 made of an elastic body assure the electric connection. They absorb dimensional changes (expansion or shrinkage) of the module in association with temperature changes and mechanical shocks and the semiconductor elements 1 are subject to no excessive stress.

(4) The column intervals of a plurality of columns of the split module 61 can be changed as appropriate and the thickness of the conductive wires 66 can be set on an arbitrary basis. Then, any proportion between natural lighting (see-through property) and power generation can be available and a panel consisting of solar battery modules 60, light emitting diode modules, or their combination and also serving as a beautiful building material can be produced.

Partial modifications of Embodiments 2 will be described hereafter.

However, modifications with regard to the semiconductor element 1 are the same as those described for the above embodiment and their explanation is omitted here.

[1] The numbers of rows and columns of the matrix of a plurality of semiconductor elements 1 in the split module 61 are given by way of example. A split module can have larger numbers of rows and columns. The number of split modules 61 installed in the solar battery module 60 is not restricted to two and the number can be selected on an arbitrary basis. A plurality of split modules 61 can be arranged in a plurality of columns, not in a column, in the solar battery module 60. In other words, a plurality of split modules 61 can be arranged in a matrix of a plurality of rows and columns in a solar battery module 60. In such a case, the retention parts 68a of the split module 61 can be omitted and the split module 61 can abut against the inner surface of the recess 65.

[2] With regard to the external terminals 76 of the solar battery module 60, it is advantageous for connecting in series a plurality of solar battery modules 60 that one of the external terminals 76 (for example the one on the positive electrode end) protrudes as shown in the figure and the other external terminal 76 (for example the one on the negative electrode end) is retracted in the terminal mounting opening and connectable to the one external terminal 76 (for example the one on the positive electrode end) of an adjacent solar battery module 60.

[3] When the solar battery module 60 is constituted as a wall material that does not require natural lighting or see-through property, a light reflecting or light scattering plate or sheet can be provided behind the semiconductor elements 1. Light transmitted between the semiconductor elements 1 is reflected behind the semiconductor elements 1 and increases the output of the semiconductor elements 1 in the solar battery module 60. Light reflected forward increases brightness in a light emitting diode module.

[4] Applications include solar battery modules integrated into building materials such as roof, skylight, window, curtain wall, facade, eave, and looper, outdoor light emitting diode displays, and functional units for solar power generation or display or both as a part of advertising pillars, automobiles, aircraft, and boats.

[5] Various sensors, signal receiver, signal transmitter, AC/DC converter, frequency converter, logic circuits, and CPU and peripheral circuitry can be mounted on the lands 73 of the casing members 63 to control the input/output of the solar battery module or light emitting diode module.

Embodiment 3

A semiconductor element 1A having light emission capability relating to Embodiment 3 is a rod-like light emitting diode. The semiconductor element 1A can be installed in the semiconductor module 20 of Embodiment 1 in place of the semiconductor element 1 to constitute a semiconductor module for light emission. Alternatively, the semiconductor element 1A can be installed in the semiconductor module 60 of Embodiment 2 in place of the semiconductor element 1 to constitute a semiconductor module for light emission.

The light emitting semiconductor element 1A will be described hereafter.

Figure 18:
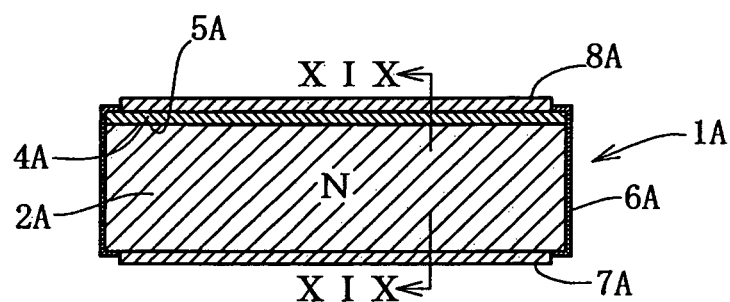
FIG. 18 is a cross-sectional view of a light emitting semiconductor element relating to Embodiment 3.
Figure 19:
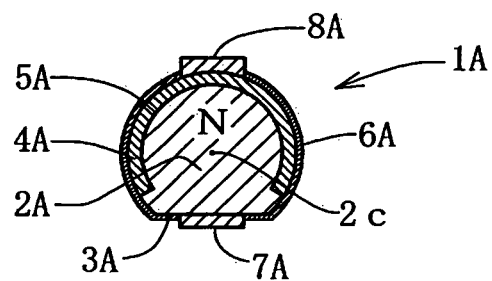
FIG. 19 is a cross-sectional view at the line XIX-XIX in FIG. 18.

As shown in FIGS. 18 and 19, the semiconductor element 1A comprises a base 2A, a flat area 3A in the shape of a band or strip parallel to the axis 2c of the base 2A, a diffusion layer 4A, a pn-junction 5A, a negative electrode 7A, a positive electrode 8A, and a passivation coating 6A. The semiconductor element 1A has the same structure as the power generating semiconductor element 1 of Embodiment 1. The base 2A consists of an n-type GaP (gallium phosphide) monocrystal or polycrystal and for example has a diameter of 0.5 mm and a length of approximately 5.0 mm. However, the diameter can be approximately 0.5 to 1.0 mm while the length is not restricted to 5.0 mm and can be larger than 5.0 mm.

A p-type diffusion layer 4A and a pn-junction 5A in the shape of a partial cylinder (a partial cylinder close to a cylinder) are formed by thermal-diffusing zinc (Zn) in the surface part of the base 2A with a silicon nitride ($Si_3N_4$) diffusion mask placed on the flat area 3A and its vicinity on both sides in the same manner as the above described diffusion layer 4. The pn-junction 5A has an area larger than a cross-sectional area of the base 2A in a plane orthogonal to the axis 2a.

In the same manner as the above described antireflection film 6, for example, a $TiO_2$ passivation coating 6A is formed on the entire surface except for the areas where the positive and negative electrodes 8A and 7A are formed. In the same manner as the positive and negative electrodes 7 and 8 of the above embodiment, the negative and positive electrodes 7A and 8A are formed in the shape of a band or strip extending over the entire length. The negative electrode 7A is provided on the flat area 3A (a band-shaped area) at the center in the width direction and electrically ohmic-connected to the base 2A. The positive electrode 8A is provided at a position opposite to the negative electrode 9B with regard to the axis 2c of the base 2A and electrically ohmic-connected to the p-type diffusion layer 4A.

The light emitting semiconductor element 1A (light emitting diode) emits red light from the pn-junction 5A radially at nearly the same intensity when a forward current flows from the positive electrode 8A to negative electrode 7A. The light emission is symmetric about the plane containing the positive and negative electrodes 8A and 7A. The generated red light is emitted radially at the same intensity and with a wide range of directivity. Because the pn-junction 6A is in the shape of a partial cylinder close to a cylinder, the generated red light crosses the surface of the semiconductor element 1A at a right angle to exit outside. Therefore, the light is subject to less internal reflection loss and the light emission efficiency is improved. The distance between the positive and negative electrodes 8A and 7A can be maintained smaller than the diameter of the base 2A. Then, the electric resistance between the electrodes 8A and 7A can be maintained low, yielding high light emission performance and light emission capability.

Partial modifications of the above described semiconductor element 1A will be described hereafter.

The base 2A can be constituted by various known semiconductor materials (such as GaAs, SiC, CaN, and InP) to constitute a semiconductor element 1A emitting various lights. The separate conductive layer having a conductivity type different from the base 2A and forming the pn-junction 5A together with the base 2A can be formed by thermal-diffusion, CVD deposition, or ion implantation of an impurity.

For example, a light emitting diode can be constituted by forming the base 2A using an n-type GaAs monocrystal and forming the separate conductive layer as a diffusion layer obtained by thermal-diffusing Zn. Alternatively, a light emitting diode can be constituted by forming the base 2A using an n-type GaAs monocrystal and forming the other conductive layer by thermal-diffusion, CVD deposition, or ion implantation of a p-type GaAs. Furthermore, a light emitting diode can be constituted by forming the base 2A using an n-type SiC monocrystal and forming the other conductive layer by deposition of a p-type GaN or GaInP.

INDUSTRIAL APPLICABILITY

The semiconductor module for power generation or light emission of the present application can effectively used in solar battery panels, light emitting diode displays, and light emitting diode illumination apparatuses.

What is claimed is:

1. A light receiving or light emitting semiconductor module comprising multiple rod-shaped semiconductor elements having light receiving or light emitting function comprising:
    positive and negative electrodes provided to each one semiconductor element of said multiple semiconductor elements along opposite sides relative to a longitudinal axis of said each one semiconductor element;
    a holding means for holding said multiple semiconductor elements in a manner that they are arranged in multiple columns and multiple rows with their conducting direction aligned in a column direction and multiple semiconductor elements are separable individually or in multiple groups;
    a conductive connection mechanism connecting in series the semiconductor elements in each column or in two adjacent columns among multiple columns of semiconductor elements and connecting in parallel the semiconductor elements in each row among multiple rows of semiconductor elements;
    conductive elastic members applying a mechanical pressing force in a column direction to maintain the serial connection of multiple columns of semiconductor elements by said conductive connection mechanism;
    said holding means has a tabular storage casing forming a flat storage zone for storing multiple semiconductor elements and comp rising multiple separable members, the storage casing has a pair of casing plates parting either side of said storage zone from the outside, and at least one of the casing plates is made of light transmissible glass or synthetic resin; and
    said holding means has multiple waved retention springs arranged nearly in parallel in said storage casing and comprising conductive band plates, multiple semiconductors in each row are held with their positive and negative electrodes clamped by a pair of waved retention springs, and said conductive connection mechanism comprises said multiple waved retention springs.

2. The light receiving or light emitting semiconductor module according to claim 1, wherein the plurality of semiconductor elements are retained between a plurality of troughs of one adjacent waved retention spring and a plurality of crests of another adjacent waved retention spring of said multiple waved retention springs, respectively.

3. The light receiving or light emitting semiconductor module according to claim 2, wherein the plurality of waved retention springs form a mesh structure in which the plurality of semiconductor elements are retained.

4. The light receiving or light emitting semiconductor module according to claim 1,
said storage casing has a pair of first outer frames and a pair of second outer frames provided around a periphery of said storage zone in a rectangular form between said pair of casing plates, said pair of first outer frames is provided on either side of said storage zone in parallel to a column direction; and
the pair of second outer frames is provided between a pair of ends of the pair of first outer frames in parallel to a row direction.

5. The light receiving or light emitting semiconductor module according to claim 4, wherein the second outer frames are provided with terminal plates protruding from said storage casing.

6. The light receiving or light emitting semiconductor module according to claim 5, wherein said pairs of first and second outer frames and pair of casing plates are detachably coupled by multiple bolts and nuts.

7. The light receiving or light emitting semiconductor module according to claim 4, wherein said pairs of first and second outer frames and pair of casing plates are detachably coupled by multiple bolts and nuts.

8. The light receiving or light emitting semiconductor module according to claim 5, wherein said pairs of casing plates has light transmissible elastic films on their inner surfaces.

9. The light receiving or light emitting semiconductor module according to claim 4, wherein said pairs of casing plates has light transmissible elastic films on their inner surfaces.

10. A light receiving or light emitting semiconductor module comprising multiple rod-shaped semiconductor elements having light receiving or light emitting function, characterized by comprising:
positive and negative electrodes provided to each one semiconductor element of said multiple semiconductor elements along opposite sides relative to a longitudinal axis of said each one semiconductor element;
a holding means for holding said multiple semiconductor elements in a manner that they are arranged in multiple columns and multiple rows with their conducting direction aligned in a column direction, and the multiple semiconductor elements are separable individually or in multiple groups;
a conductive connection mechanism connecting in series the semiconductor elements in each column among multiple columns of semiconductor elements and connecting in parallel the semiconductor elements in each row among multiple rows of semiconductor elements;
conductive elastic members applying a mechanical pressing force in a column direction to maintain the serial connection of multiple columns of semiconductor elements by said conductive connection mechanism;
said holding means has a tabular storage casing forming a flat storage zone for storing multiple semiconductor elements and comprising multiple separable members, the storage casing has a pair of casing plates parting either side of said storage zone from the outside, and at least one of the casing plates is made of light transmissible glass or synthetic resin;
the multiple semiconductor elements divided into multiple groups;
the multiple semiconductor elements in each group are arranged in a matrix of multiple rows and multiple columns and adjacent semiconductor elements among multiple semiconductor elements in each row abut against each other or are slightly spaced from each other;
said conductive connection mechanism has multiple conductive wires provided between rows of semiconductor elements and a pair of connection conductors provided outside a pair of end rows in a column direction in parallel to a row direction;
the multiple semiconductor elements, the multiple conductive wires, a pair of connection conductors in each group are partly embedded in a light transmissible synthetic resin to constitute a tabular segment module;
said multiple segment modules are serially arranged in the storage zone of said storage casing and connection conductors of adjacent segment modules are electrically connected;
said storage casing comprises a pair of casing plates superimposed face-to-face, said casing plates each have sidewalls closing the storage zone at a pair of ends in the row direction and terminal mounting grooves extending from the storage zone to either end of the casing plate in the column direction, and terminal plate protruding outside are mounted in a pair of facing terminal mounting grooves of the storage casing, respectively, and fixed to the storage casing; and
corrugated springs as said conductive elastic members are mounted between said terminal plates and the connection conductors of the segment modules that face the terminal plates, the elastic biasing force of the pair of corrugated springs maintains the serial electrical connection of multiple segment modules.

* * * * *